United States Patent
Kim et al.

(10) Patent No.: US 8,422,320 B2
(45) Date of Patent: Apr. 16, 2013

(54) DATA STROBE SIGNAL GENERATION CIRCUIT

(75) Inventors: Kwang Soon Kim, Mokpo-si (KR); Bok Rim Ko, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 21 days.

(21) Appl. No.: 13/243,110

(22) Filed: Sep. 23, 2011

(65) Prior Publication Data
US 2012/0106276 A1 May 3, 2012

(30) Foreign Application Priority Data
Oct. 27, 2010 (KR) .................. 10-2010-0105463

(51) Int. Cl.
*G11C 7/00* (2006.01)
(52) U.S. Cl.
USPC .......................................... 365/193; 365/226
(58) Field of Classification Search .................. 365/193, 365/226
See application file for complete search history.

(56) References Cited

U.S. PATENT DOCUMENTS

| | | | |
|---|---|---|---|
| 6,865,701 B1 * | 3/2005 | Youngs et al. | 714/718 |
| 6,894,945 B2 * | 5/2005 | Sawada | 365/233.11 |
| 2003/0031082 A1 * | 2/2003 | Sawada | 365/233 |
| 2008/0232178 A1 * | 9/2008 | Aoki | 365/193 |
| 2008/0298147 A1 * | 12/2008 | Matsui | 365/201 |
| 2009/0043955 A1 * | 2/2009 | Butt et al. | 711/105 |

FOREIGN PATENT DOCUMENTS

| | | |
|---|---|---|
| KR | 1020020037525 A | 5/2002 |
| KR | 100803365 B1 | 2/2008 |

* cited by examiner

*Primary Examiner* — Michael Tran
(74) *Attorney, Agent, or Firm* — William Park & Associates Ltd.

(57) ABSTRACT

A data strobe signal generation circuit includes: an enable signal generation unit configured to decode a test signal and generate an enable signal; an internal clock generation unit configured to generate a rising clock signal and a falling clock signal in response to the test signal; and a data strobe signal output unit configured to selectively buffer first and second powers in response to the rising clock signal and the falling clock signal, and output a data strobe signal.

13 Claims, 4 Drawing Sheets

DATA STROBE SIGNAL GENERATION CIRCUIT

CROSS-REFERENCES TO RELATED APPLICATIONS

The present application claims priority under 35 U.S.C. 119(a) to Korean Application No. 10-2010-0105463, filed on Oct. 27, 2010, in the Korean intellectual property Office, which is incorporated herein by reference in its entirety.

BACKGROUND

Highly integrated semiconductor memory chips to reduce size meant longer test time for evaluating the memory characteristics. To reduce the test time, a parallel test or testing a plurality of bits at a time is used.

For example, to perform a parallel test on a semiconductor memory chip with 1M as a unit, four bits would be tested at the same time. For a semiconductor memory chip with 4M as a unit, eight bits would be tested at the same time. For a semiconductor memory chip with 16M as a unit, 16 or more bits would be tested at the same time.

In addition, a semiconductor memory chip includes a plurality of data pads through which data are inputted and outputted. Also, the semiconductor memory chip includes a plurality of data strobe signal pads which transmit data strobe signals used in capturing the data at the receiver. When the known test is performed, the data signals and the data strobe signals are applied only to some data pads and data strobe signal pads selected among the plurality of data pads and data strobe signal pads included in the semiconductor memory chip. That is, in the known test, the data outputted through the selected data pads may be verified to check the characteristics of output drivers coupled to the selected data pads.

Therefore, the characteristics of output drivers coupled to unselected data pads among the plurality of data pads included in the semiconductor memory chip cannot be checked through the known test method.

SUMMARY

An embodiment of the present invention relates to a data strobe signal generation circuit which is capable of verifying the characteristics of data drivers coupled to all data pads included in a semiconductor memory chip.

In an embodiment, a data strobe signal generation circuit includes: an enable signal generation unit configured to decode a test signal and generate an enable signal; an internal clock generation unit configured to generate a rising clock signal and a falling clock signal in response to the test signal; and a data strobe signal output unit configured to selectively buffer first and second powers in response to the rising clock signal and the falling clock signal, and output a data strobe signal. The data strobe signal is disabled in response to the enable signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
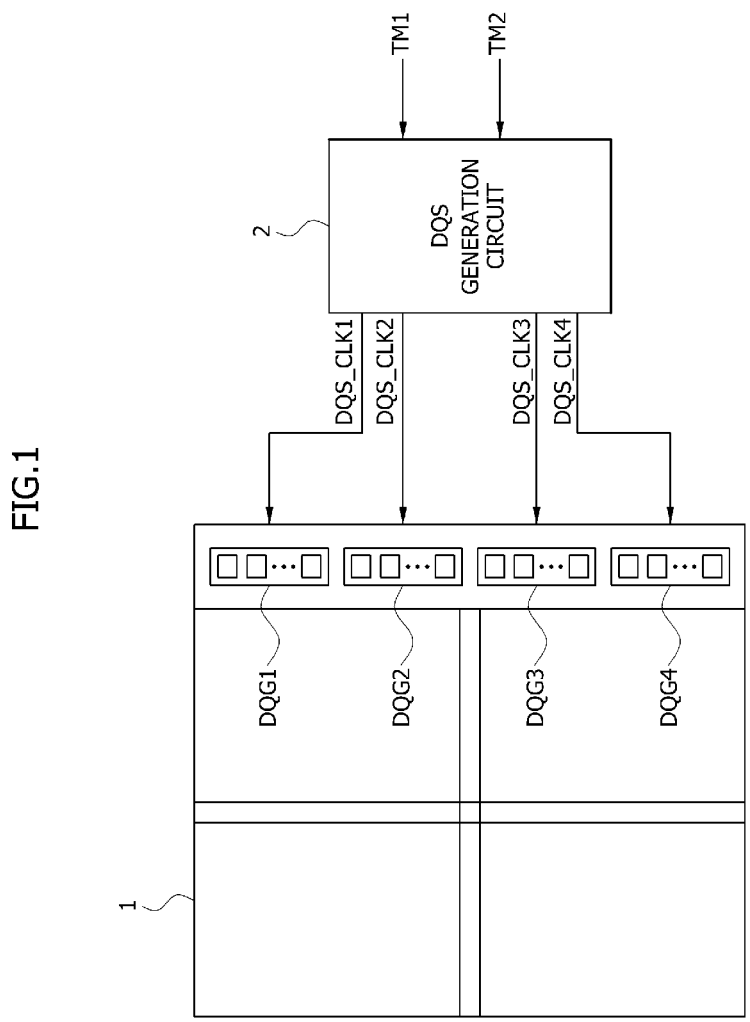
FIG. 1 is a block diagram illustrating the configuration of an integrated circuit including a data strobe signal generation circuit in accordance with an embodiment of the present invention.

FIG. 1 is a block diagram illustrating the configuration of an integrated circuit including a data strobe signal generation circuit in accordance with an embodiment of the present invention.

Referring to FIG. 1, the integrated circuit in accordance with an embodiment of the present invention includes a data strobe signal generation circuit 2 configured to test a semiconductor memory chip 1. The semiconductor memory chip 1 includes first to fourth data pad groups DQG1 to DQG4. The data strobe signal generation circuit 2 is configured to generate first to fourth data strobe signals DQS_CLK1 to DQS_CLK4 in response to first and second test signals TM1 and TM2. Each of the first to fourth data pad groups DQG1 to DQG4 includes a plurality of data pads. The first data strobe signal DQS_CLK1 is applied with input or output of data of the first data pad group DQG1, the second data strobe signal DQS_CLK2 is applied with input or output of data of the second data pad group DQS2, the third data strobe signal DQS_CLK3 is applied with input or output of data of the third data pad group DQS3, and the fourth data strobe signal DQS_CLK4 is applied with input and output of data of the fourth data pad group DQS4.

Figure 2:
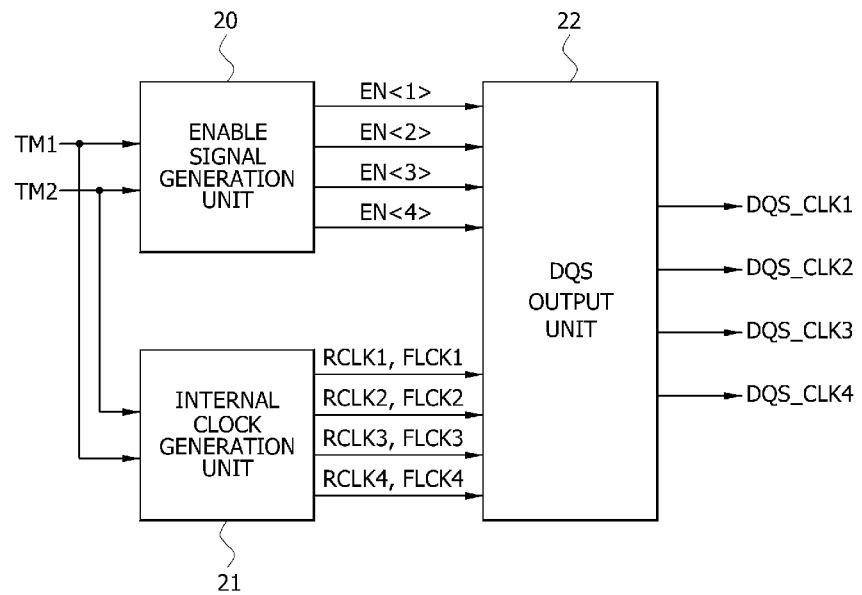
FIG. 2 is a block diagram illustrating the configuration of the data strobe signal generation circuit of FIG. 1.

Referring to FIG. 2, the data strobe signal generation circuit 2 includes an enable signal generation unit 20, an internal clock generation unit 21, and a data strobe signal output unit 22. The enable signal generation unit 20 is configured to decode the first and second test signals TM1 and TM2 and generate first to fourth enable signals EN<1:4>. The internal clock generation unit 21 is configured to generate first to fourth rising clock signals RCLK1 to RCLK4 and first to fourth falling clock signals FCLK1 to FCLK4, in response to the first and second test signals TM1 and TM2. The data strobe signal output unit 22 is configured to output the first to fourth data strobe signals DQS_CLK1 to DQS_CLK4, in response to the first to fourth enable signals EN<1:4>, the first to fourth rising clock signals RCLK1 to RCLK4, and the first to fourth falling clock signals FCLK1 to FCLK4.

Figure 3:
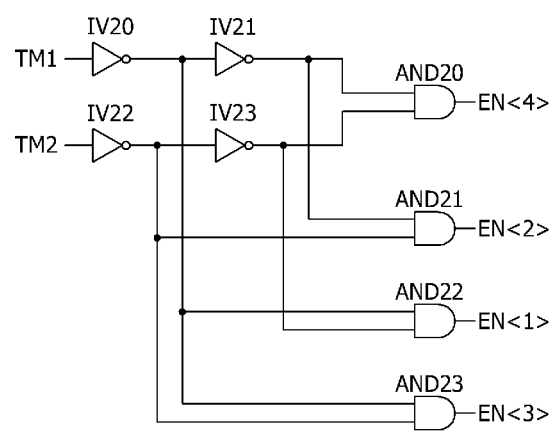
FIG. 3 is a circuit diagram of an enable signal generation unit included in the data strobe signal generation circuit of FIG. 2.

Referring to FIG. 3, the enable signal generation unit 20 includes inverts IV20 to IV23 and AND gates AND20 to AND23. The enable signal generation unit 20 selectively enables one of the first to fourth enable signals EN<1:4> according to a level combination of the first and second test signals TM1 and TM2, as shown in Table 1 below.

TABLE 1

| TM1 | TM2 | EN<4> | EN<3> | EN<2> | EN<1> |
|---|---|---|---|---|---|
| L | L | L | H | L | L |
| L | H | L | L | L | H |

TABLE 1-continued

| TM1 | TM2 | EN<4> | EN<3> | EN<2> | EN<1> |
|-----|-----|-------|-------|-------|-------|
| H   | L   | L     | L     | H     | L     |
| H   | H   | H     | L     | L     | L     |

Figure 4:
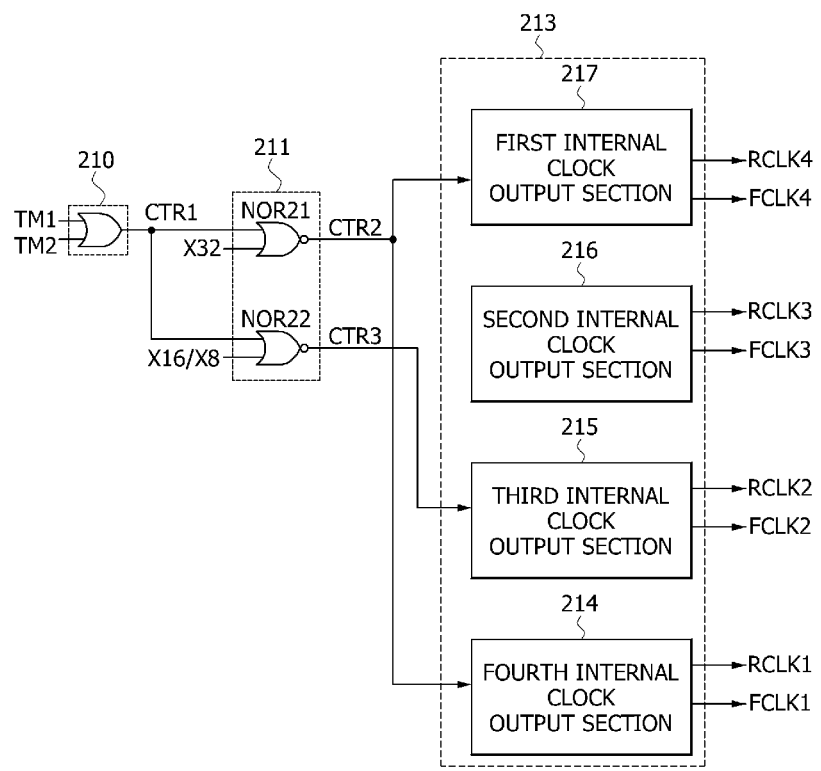
FIG. 4 is a circuit diagram of an internal clock generation unit included in the data strobe signal generation circuit of FIG. 2.

Referring to FIG. 4, the internal clock generation unit 21 includes a first control signal generation section 210, a second control signal generation section 211, and an internal clock output section 213.

The first control signal generation section 210 is configured to generate a first control signal CTR1 which is enabled to a logic high level when one of the first and second test signals TM1 and TM2 is applied at a logic high level.

The second control signal generation section 211 includes a NOR gate NOR21 and a NOR gate NOR22. The NOR gate NOR21 is configured to receive the first control signal CTR1 and a first mode signal X32, and perform a NOR operation on the received signals. The NOR gate NOR22 is configured to receive the first control signal CTR1 and a second mode signal X16/X8, and perform a NOR operation on the received signals. Here, the first mode signal X32 is enabled to a logic high level for an operation of inputting/outputting 32 data at the same time through one column operation, and the second mode signal X16/X8 is enabled to a logic high level for an operation of inputting/outputting 16 or 8 data at the same time through one column operation. When the first and second test signals TM1 and TM2 are applied to perform a test, both of the first mode signal X32 and the second mode signal X16/X8 may be disabled to a logic low level. The second control signal generation unit 211 generates second and third control signals CTR2 and CTR3 which are enabled to a logic low level when the first control signal CTR1 enabled to a logic high level is inputted.

The internal clock output section 213 includes a first internal clock output section 214, a second internal clock output section 215, a third internal clock output section 216, and a fourth internal clock output section 217. The first internal clock output section 214 is configured to generate the first rising clock signal RCLK1 and the first falling clock signal FCLK2 which are toggled when the second control signal CTR2 enabled to a logic low level is inputted. The second internal clock output section 215 is configured to generate the second rising clock signal RCLK2 and the second falling clock signal FCLK2 which are toggled when the third control signal CTR3 enabled to a logic low level is inputted. The third internal clock generation section 216 is configured to generate the third rising clock signal RCLK3 and the third falling clock signal FCLK3. The fourth internal clock generation section 217 is configured to generate the fourth rising clock signal RCLK4 and the fourth falling clock signal FCLK4 which are toggled when the second control signal CTR2 enabled to a logic low level is inputted.

In the internal clock generation unit 21 configured in such a manner, when both of the first and second test signals TM1 and TM2 are at a logic low level, the first control signal CTR1 is disabled to a logic low level and the second and third control signals CTR2 and CTR3 are disabled to a logic high level, only the third internal clock output section 216 is driven, and outputs the third rising clock signal RCLK3 and the third falling clock signal FCLK3. On the other hand, when at least one of the first and second test signals TM1 and TM2 is at a logic low level, all the first to fourth internal clock output sections 214 to 217 are driven by the first control signal CTR1 enabled to a logic high level and the second and third control signals CTR2 and CTR3 enabled to a logic low level, and output the first to fourth rising clock signals RCLK1 to RCLK4 and the first to fourth falling clock signals FCLK1 to FCLK4.

Figure 5:
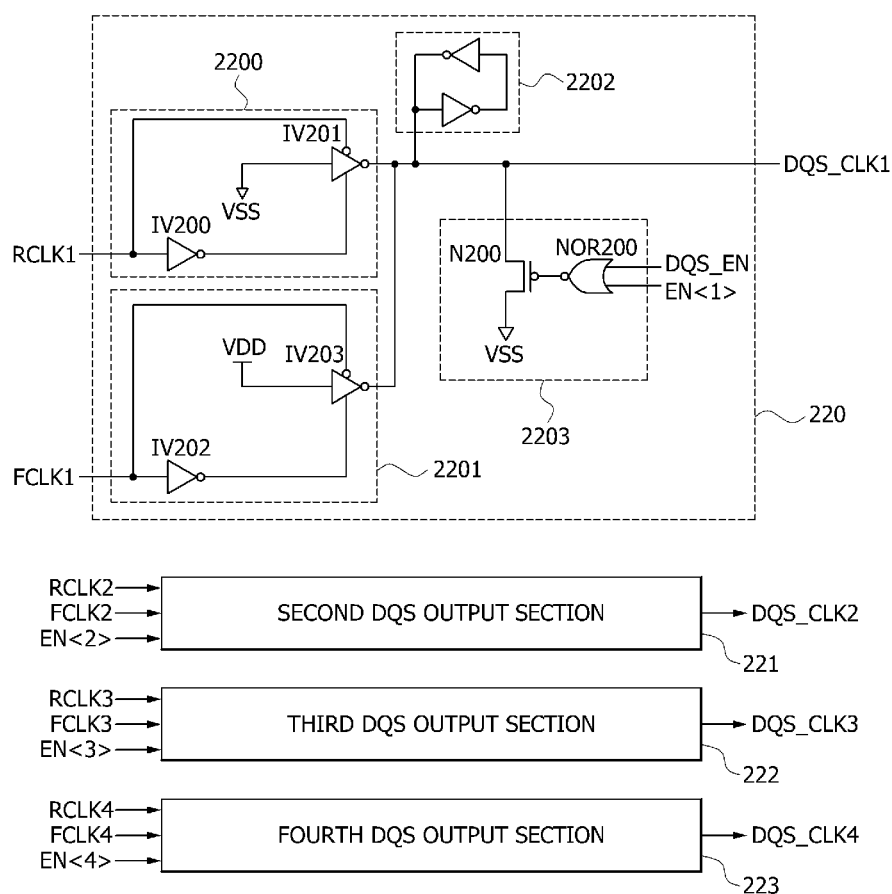
FIG. 5 is a circuit diagram of a data strobe signal output unit included in the data strobe signal generation circuit of FIG. 2.

Referring to FIG. 5, the data strobe signal output unit 22 includes a first data strobe signal output section 220, a second data strobe signal output section 221, a third data strobe signal output section 222, and a fourth data strobe signal output section 223.

The first data strobe signal output section 220 includes a first buffer section 2200, a second buffer section 2201, a latch section 2202, and a driving section 2203. The first buffer section 2200 includes inverters IV200 and IV201 and is configured to buffer a ground voltage VSS in synchronization with the first rising clock signal RCKL1 and output the buffered signal as the first data strobe signal DQS_CLK1. The second buffer section 2201 includes inverters IV202 and IV203 and is configured to buffer a power supply voltage VDD in synchronization with the first falling clock signal FCLK1 and output the buffered signal as the first data strobe signal DQS_CLK1. In addition, a combined signal of the output of the first buffer section 2200 and the output of the first buffer section 2200 may become the first data strobe signal DQS_CLK1. The latch section 2202 is configured to latch the first data strobe signal DQS_CLK1. The driving section 2203 includes a NOR gate NOR200 and an NMOS transistor N200. The NOR gate NOR200 is configured to receive a DQS enable signal DQS_EN and the first enable signal EN<1>, and perform a NOR operation on the received signals. The NMOS transistor N200 is configured to drive the first data strobe signal DQS_CLK1 to the level of the ground voltage VSS and disable the first data strobe signal DQS_CLK1, in response to an output signal of the NOR gate NOR200. Here, the DQS enable signal DQS_EN may be set to a logic low level and applied in a state in which the first and second test signals TM1 and TM2 are applied.

The first data strobe signal output section 220 configured in such a manner outputs the first data strobe signal DQS_CLK1 which is enabled in a toggling state, when the first enable signal EN<1> enabled to a logic high level is inputted in a state in which the first rising clock signal RCLK1 and the first falling clock signal FCLK1, which are toggled, are inputted. On the other hand, the first data strobe signal DQS_CLK1 outputted from the first data strobe signal output section 220 is driven to the level of the ground voltage VSS and disabled, when the first enable signal EN<1> is disabled to a logic low level.

The second data strobe signal output section 221 outputs a second data strobe signal DQS_CLK2 which is toggled in synchronization with the second rising clock signal RCLK2 and the second falling clock signal FCLK2 when the second enable signal EN<2> is at a logic high level, and outputs a second data strobe signal DQS_CLK2 which is driven to a logic low level when the second enable signal EN<2> is at a logic low level. The third data strobe signal output section 222 outputs a third data strobe signal DQS_CLK3 which is toggled in synchronization with the third rising clock signal RCLK3 and the third falling clock signal FCLK3 when the third enable signal EN<3> is at a logic high level, and outputs a third data strobe signal DQS_CLK3 which is driven to a logic low level when the third enable signal EN<3> is at a logic low level. The fourth data strobe signal output section 223 outputs a fourth data strobe signal DQS_CLK4 which is toggled in synchronization with the fourth rising clock signal RCLK4 and the fourth falling clock signal FCLK4 when the fourth enable signal EN<4> is at a logic high level, and outputs a fourth data strobe signal DQS_CLK4 which is driven to a logic low level when the fourth enable signal EN<4> is at a logic low level. The configurations of the second to third data strobe signal output sections 222 to 223 may be similar to that of the first data strobe signal output section 221, except for the kinds of input/output signals. Thus, the detailed descriptions thereof are omitted herein.

The operation of the data strobe signal generation circuit 2 included in the integrated circuit configured in the above-described manner will be described as follows.

First, when both of the first and second test signals TM1 and TM2 are at a logic low level, the enable signal generation unit 20 generates a third enable signal EN<3> enabled to a logic low level, and the internal clock generation unit 21 generates a third rising clock signal RCLK3 and a third falling clock signal FCLK3, which are toggled. The third data strobe signal output section 222 of the data strobe signal output unit 22 is driven by the third enable signal EN<3> enabled to a logic high level and the toggled third rising and falling clock signals RCLK3 and FCLK3, and generates a third data strobe signal DQS_CLK3. Therefore, it is possible to verify the characteristics of output drivers coupled to the third data pad group DQG3 of the semiconductor memory chip 1.

Next, when the first test signal TM1 is at a logic low level and the second test signal TM2 is at a logic high level, the enable signal generation unit 20 generates a first enable signal EN<1> enabled to a logic high level, and the internal clock generation unit 21 generates first to fourth rising clock signals RCLK1 to RCLK4 and first to fourth falling clock signals FCLK1 and FCLK4, which are toggled. The first data strobe signal output section 220 of the data strobe signal output unit 22 is driven by the first enable signal EN<1> enabled to a logic high level, the toggled first to fourth rising clock signals RCLK1 to RCLK4, and the toggled first to fourth falling clock signals FCLK1 to FCLK4, and generates a first data strobe signal DQS_CLK1. Therefore, it is possible to verify the characteristics of output drivers coupled to the first data pad group DQG1 of the semiconductor memory chip 1.

Next, when the first test signal TM1 is at a logic high level and the second test signal TM2 is at a logic low level, the enable signal generation unit 20 generates a second enable signal EN<2> enabled to a logic high level, and the internal clock generation unit 21 generates first to fourth rising clock signals RCLK1 to RCLK4 and first to fourth falling clock signals FCLK1 and FCLK4, which are toggled. The second data strobe signal output section 221 of the data strobe signal output unit 22 is driven by the second enable signal EN<2> enabled to a logic high level, the toggled first to fourth rising clock signals RCLK1 to RCLK4, and the toggled first to fourth falling clock signals FCLK1 to FCLK4, and generates a second data strobe signal DQS_CLK2. Therefore, it is possible to verify the characteristics of output drivers coupled to the second data pad group DQG2 of the semiconductor memory chip 1.

Next, when both of the first and second test signals TM1 and TM2 are at a logic high level, the enable signal generation unit 20 generates a fourth enable signal EN<4> enabled to a logic high level, and the internal clock generation unit 21 generates first to fourth rising clock signals RCLK1 to RCLK4 and first to fourth falling clock signals FCLK1 to FCLK 4, which are toggled. The fourth data strobe signal output section 223 of the data strobe signal output unit 22 is driven by the fourth enable signal EN<4> enabled to a logic high level, the toggled first to fourth rising clock signals RCLK1 to RCLK4, and the toggled first to fourth falling clock signals FCLK1 to FCLK 4, and generates a fourth data strobe signal DQS_CLK4. Therefore, it is possible to verify the characteristics of output drivers coupled to the fourth data pad group DQG4 of the semiconductor memory chip 1.

The integrated circuit in accordance with an embodiment of the present invention provides the data strobe signal generation circuit 2 which selectively toggles and outputs any one of the first to fourth data strobe signals DQS_CLK1 to DQS_CLK4 according to a combination of the first and second test signal TM1 and TM2. The first to fourth data pad groups DQG1 to DQG4 of the semiconductor memory chip 1 are selectively driven by the first to fourth data strobe signals DQS_CLK1 to DQS_CLK4 which are selectively toggled and outputted by the data strobe signal generation circuit 2, which makes it possible to verify the characteristics of all the output drivers coupled to the first to fourth data pad groups DQG1 to DQG4.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A data strobe signal generation circuit comprising:
    an enable signal generation unit configured to decode a test signal and generate an enable signal;
    an internal clock generation unit configured to generate a rising clock signal and a falling clock signal in response to the test signal; and
    a data strobe signal output unit configured to selectively buffer first and second powers in response to the rising clock signal and the falling clock signal, and output a data strobe signal,
    wherein the data strobe signal is disabled when the enable signal is disabled.

2. The data strobe signal generation circuit of claim 1, wherein the data strobe signal output unit comprises:
    a first buffer section configured to buffer the first power in response to the rising clock signal and output the buffered signal as the data strobe signal;
    a second buffer section configured to buffer the second power in response to the falling clock signal and output the buffered signal as the data strobe signal; and
    a driving section configured to drive the data strobe signal to a specific level and disable the data strobe signal, when the enable signal is disabled.

3. The data strobe signal generation circuit of claim 2, wherein the first power comprises a ground voltage, and the second power comprises a power supply voltage.

4. The data strobe signal generation circuit of claim 1, wherein the enable signal generation unit decodes first and second test signals and generates first to fourth enable signals which are selectively enabled.

5. The data strobe signal generation circuit of claim 4, wherein the internal clock generation unit generates first to fourth rising clock signals and first to fourth falling clocks when the first or second test signal is enabled.

6. The data strobe signal generation circuit of claim 5, wherein the internal clock generation unit comprises:
    a first control signal generation section configured to generate a first control signal which is enabled when the first or second test signal is enabled;
    a second control signal generation section configured to generate second and third control signals in response to the first control signal and a mode signal; and
    an internal clock output section configured to output the first to fourth rising clock signals and the first to fourth falling clock signals in response to the second and third control signals.

7. The data strobe signal generation circuit of claim 6, wherein both of the second and third control signals are enabled when the first control signal is enabled.

8. The data strobe signal generation circuit of claim 6, wherein the internal clock output section comprises:
- a first internal clock output section configured to output the first rising clock signal and the first falling clock signal in response to the second control signal;
- a second internal clock output section configured to output the second rising clock signal and the second falling clock signal in response to the third control signal;
- a third internal clock output section configured to output the third rising clock signal and the third falling clock signal; and
- a fourth internal clock output section configured to output the fourth rising clock signal and the fourth falling clock signal in response to the second control signal.

9. The data strobe signal generation circuit of claim 6, wherein the data strobe signal output unit comprises:
- a first data strobe signal output section configured to selectively buffer the first and second powers in response to the first rising clock signal and the first falling clock signal, and output the buffered signal as a first data strobe signal; and
- a second data strobe signal output section configured to selectively buffer the first and second powers in response to the second rising clock signal and the second falling clock signal, and output the buffered signal as a second data strobe signal.

10. The data strobe signal generation circuit of claim 9, wherein the first data strobe signal is disabled when the first enable signal is disabled.

11. The data strobe signal generation circuit of claim 9, wherein the second data strobe signal is disabled when the second enable signal is disabled.

12. The data strobe signal generation circuit of claim 9, wherein the first data strobe signal output section comprises:
- a first buffer configured to buffer the first power in response to the first rising clock signal and output the buffered signal as the first data strobe signal;
- a second buffer configured to buffer the second power in response to the first falling clock signal and output the buffered signal as the first data strobe signal; and
- a driver configured to drive the first data strobe signal to a specific level and disable the first data strobe signal, when the first enable signal is disabled.

13. The data strobe signal generation circuit of claim 9, wherein the first power comprises a ground voltage, and the second power comprises a power supply voltage.

* * * * *